United States Patent
Ueda et al.

(10) Patent No.: US 12,052,875 B2
(45) Date of Patent: Jul. 30, 2024

(54) MAGNETIC MEMORY

(71) Applicant: KIOXIA CORPORATION, Tokyo (JP)

(72) Inventors: Yoshihiro Ueda, Yokohama Kanagawa (JP); Naoharu Shimomura, Meguro Tokyo (JP); Tsuyoshi Kondo, Kawasaki Kanagawa (JP)

(73) Assignee: Kioxia Corporation, Tokyo (JP)

(*) Notice: Subject to any disclaimer, the term of this patent is extended or adjusted under 35 U.S.C. 154(b) by 527 days.

(21) Appl. No.: 17/410,806

(22) Filed: Aug. 24, 2021

(65) Prior Publication Data
US 2022/0293678 A1    Sep. 15, 2022

(30) Foreign Application Priority Data

Mar. 11, 2021  (JP) .................. 2021-039069

(51) Int. Cl.
*H10B 61/00*  (2023.01)
*G11C 11/16*  (2006.01)
*H10N 50/10*  (2023.01)
*H10N 50/80*  (2023.01)

(52) U.S. Cl.
CPC ............ *H10B 61/22* (2023.02); *G11C 11/161* (2013.01); *G11C 11/1673* (2013.01); *G11C 11/1675* (2013.01); *H10N 50/10* (2023.02); *H10N 50/80* (2023.02)

(58) Field of Classification Search
CPC ... H10B 61/22; G11C 11/161; G11C 11/1673; G11C 11/1675; H10N 50/80; H10N 50/10
USPC .......................................... 257/421
See application file for complete search history.

(56) References Cited

U.S. PATENT DOCUMENTS

| | | | |
|---|---|---|---|
| 7,005,350 B2* | 2/2006 | Walker | H10B 69/00 257/E21.679 |
| 7,505,321 B2* | 3/2009 | Scheuerlein | H10B 43/30 365/185.11 |
| 7,910,914 B2 | 3/2011 | Tanaka et al. | |
| 10,460,783 B2 | 10/2019 | Ueda | |

(Continued)

FOREIGN PATENT DOCUMENTS

| | | |
|---|---|---|
| JP | 2008500719 A | 1/2008 |
| JP | 5091491 B2 | 12/2012 |

(Continued)

*Primary Examiner* — Jami Valentine Miller
(74) *Attorney, Agent, or Firm* — Kim & Stewart LLP

(57) ABSTRACT

A magnetic memory includes a planar electrode and a first wiring spaced from the electrode. A first magnetic member is between the electrode and the first wiring. The first magnetic member has a first end facing the first wiring and a second end facing the electrode. A magnetoresistive element is connected to the first end. A transistor is between the magnetoresistive element and the first wiring. The transistor has a channel layer and a gate electrode covering at least part of an outer periphery of the channel layer. One end of the channel layer is connected to the magnetoresistive element, and another end of the channel layer is connected to the first wiring. A second wiring has a portion between the electrode and the second end of the first magnetic member. A control circuit is electrically connected to the gate electrode, the electrode, and the first and second wirings.

20 Claims, 6 Drawing Sheets

(56) References Cited

U.S. PATENT DOCUMENTS

| | | | |
|---|---|---|---|
| 2007/0194225 A1* | 8/2007 | Zorn | G01Q 30/10 |
| | | | 250/306 |
| 2007/0222074 A1 | 9/2007 | Bakkers et al. | |
| 2014/0374860 A1* | 12/2014 | Suzuki | H10B 61/22 |
| | | | 257/422 |
| 2015/0235959 A1* | 8/2015 | Lee | H01L 23/53252 |
| | | | 257/750 |
| 2015/0380638 A1 | 12/2015 | Ootera et al. | |
| 2019/0287593 A1 | 9/2019 | Ueda | |
| 2021/0351340 A1* | 11/2021 | Frougier | H10B 61/20 |
| 2022/0293678 A1* | 9/2022 | Ueda | G11C 11/1673 |

FOREIGN PATENT DOCUMENTS

| | | |
|---|---|---|
| JP | 2016009806 A | 1/2016 |
| JP | 2019164848 A | 9/2019 |
| WO | 2020174569 A1 | 9/2020 |

\* cited by examiner

MAGNETIC MEMORY

CROSS-REFERENCE TO RELATED APPLICATION

This application is based upon and claims the benefit of priority from Japanese Patent Application No. 2021-039069, filed Mar. 11, 2021, the entire contents of which are incorporated herein by reference.

FIELD

Embodiments described herein relate generally to a magnetic memory.

BACKGROUND

A magnetic memory that moves (shifts) a domain wall of a magnetic member by feeding a current (shift current) through the magnetic member is known. In a case where a plurality of magnetic members are provided, both a write portion and a read portion of each magnetic member are provided on the same side. Therefore, it is more difficult to achieve high integration with such a magnetic memory.

DETAILED DESCRIPTION

Embodiments provide a magnetic memory capable of achieving high integration.

In general, according to one embodiment, a magnetic memory includes an electrode that extends in a plane including a first direction and a second direction crossing the first direction; a first interconnection wiring that extends along the first direction and is spaced from the electrode in a third direction orthogonal to the plane; a first magnetic member between the electrode and the first interconnection wiring in the third direction, the first magnetic member having a first end facing the first interconnection wiring and a second end facing the electrode; a first magnetoresistive element electrically connected to the first end of the first magnetic member; a first transistor between the first magnetoresistive element and the first interconnection wiring. The first transistor has a first channel layer extending in the third direction and a first gate electrode covering at least part of an outer periphery of the first channel layer. One end of the first channel layer is electrically connected to the first magnetoresistive element and another end of the first channel layer is electrically connected to the first interconnection wiring. A second interconnection wiring has a portion between the electrode and the second end of the first magnetic member. A control circuit is electrically connected to the first gate electrode, the electrode, the first interconnection wiring, and the second interconnection wiring.

Embodiments of the disclosure will be described hereinafter with reference to the drawings. The drawings are either schematic or conceptual, and relationships between thicknesses and plane dimensions of portions, proportions of the portions, and the like are not necessarily identical to actual relationships or the like. The same portions can be depicted differently in dimensions or proportions depending on the drawings. In the specification and the drawings, elements to similar those described previously with reference to the drawings are denoted by the same reference signs and detailed descriptions thereof are omitted as appropriate.

First Embodiment

Figure 1:
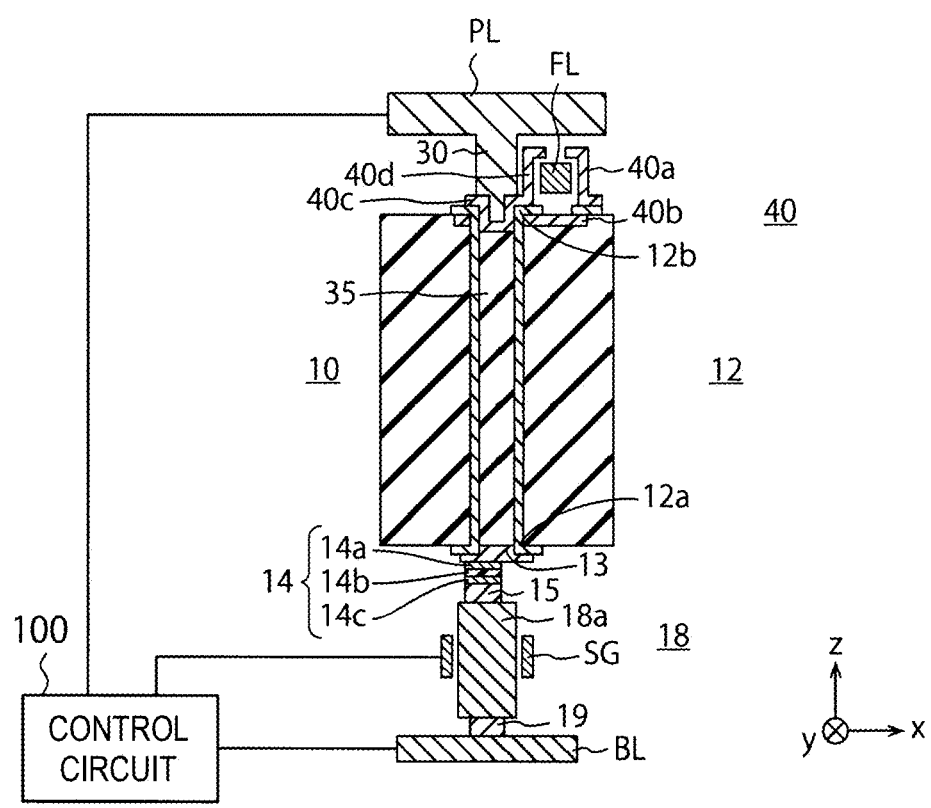
FIG. 1 is a cross-sectional view of a memory cell in a magnetic memory according to a first embodiment.

A magnetic memory according to a first embodiment will be described with reference to FIG. 1. The magnetic memory according to the first embodiment has at least one memory cell. FIG. 1 shows configurations of this memory cell. This memory cell 10 comprises a magnetic member 12 (such as a magnetic memory line (MML)), a non-magnetic conductive layer 13, a magnetoresistive element 14, a non-magnetic conductive layer 15, a vertical thin film transistor (VTFT) 18, a non-magnetic conductive layer 19, a non-magnetic conductive body 30, a yoke 40, a bit line BL, a plate electrode PL, and a field line FL. It is noted herein that the plate electrode PL extends along a plane including an x direction and a y direction in FIG. 1, and that a length of the plate electrode PL in the x direction is greater than a length of the field line FL in the x direction.

The magnetic member 12 has a first end portion 12a and a second end portion 12b. The magnetic member 12 is formed from a perpendicular magnetic material that extends along a first direction (z direction) from the first end portion 12a to the second end portion 12b and has a cylindrical shape. For example, an outer shape of a cross-section of the magnetic member 12 in plane perpendicular to the z direction can be a circle, an ellipse, or a polygon. It is noted that an axis of easy magnetization is perpendicular to the z direction since the magnetic member 12 is formed from the perpendicular magnetic member. Therefore, a magnetization direction of the magnetic member 12 is a radial direction and the magnetic member 12 thus has either an outward magnetization direction or an inward magnetization direction. An insulator portion 35 is disposed in the magnetic member 12. In particular, the magnetic member 12 is provided surrounding an outer periphery of the insulator portion 35.

Figure 2:
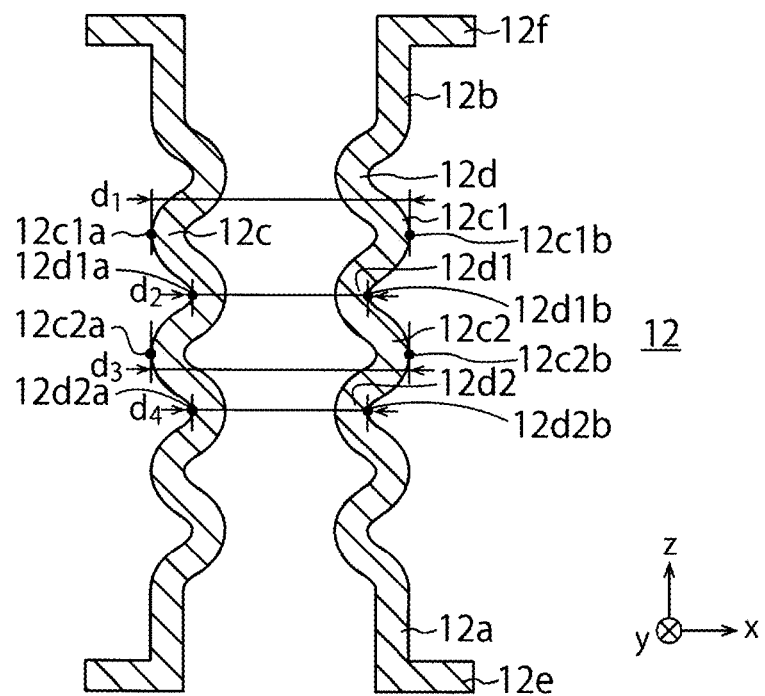
FIG. 2 is a cross-sectional view for explaining a shape of a magnetic member according to an embodiment.

FIG. 1 shows that the magnetic member 12 has a shape extending linearly from the first end portion 12a to the second end portion 12b. In actuality, as shown in FIG. 2, the magnetic member 12 the outer surface that has a plurality of regions 12c arranged along the z direction with constricted portions 12d located between these regions 12c. Furthermore, these regions 12c have at least one domain (magnetic domain). When a drive current (shift current) is supplied between the first end portion 12a and the second end portion 12b, a domain wall of the magnetic member 12 moves along the z direction. When no drive current is supplied, the domain wall stops in the constricted portions 12d. The first end portion 12a of the magnetic member 12 is electrically connected to the bit line BL, and the second end portion 12b thereof is electrically connected to the plate electrode PL. It is noted that in the present specification, "A is electrically connected to B" means that A may be connected to B either directly or indirectly via another conductive body, a resistance change portion (such as a magnetoresistive element), a switching portion (such as a selector or a transistor), and/or the like.

Moreover, as shown in FIG. 2, in the magnetic member 12, a region 12c1, a constricted portion 12d1, a region 12c2, and a constricted portion 12d2 are disposed along the z direction. The distance (corresponding to a diameter of the magnetic member 12) between end portions 12c1a and 12c1b of the region 12c1 in the x direction is d1. The distance between end portions 12d1a and 12d1b of the constricted portion 12d1 in the x direction is d2. The distance between end portions 12c2a and 12c2b of the region 12c2 in the x direction is d3. The distance between end portions 12d2a and 12d2b of the constricted portion 12d2 in the x direction is d4. The following conditions are satisfied with respect to these distances between various portions:

$d1 > d2$, $d1 > d4$, $d3 > d2$, and $d3 > d4$.

A flange portion 12e extending along a plane crossing the z direction, for example, plane orthogonal to the z direction is provided in the first end portion 12a of the magnetic member 12. A flange portion 12f extending along the plane crossing the z direction, for example, plane orthogonal to the z direction is provided in the second end portion 12b. The flange portions 12e and 12f are formed from the same perpendicular magnetic material as that of the magnetic member 12. The first end portion 12a is electrically connected to the magnetoresistive element 14 via the flange portion 12e and the non-magnetic conductive layer 13. It is noted that the non-magnetic conductive layer 13 may be omitted in some examples. In such a case, the first end portion 12a is electrically connected to the magnetoresistive element 14 via just the flange portion 12e.

The magnetoresistive element 14 reads information written to the magnetic member 12 and an MTJ (Magnetic Tunnel Junction) element, for example, is used as the magnetoresistive element 14. The following examples assume that the magnetoresistive element 14 is an MTJ element. The MTJ element 14 is configured with a free layer 14a (magnetization free layer) having a variable magnetization direction, a pinned layer 14c (magnetization pinned layer) having a fixed magnetization direction, and a non-magnetic insulating layer 14b (tunnel barrier layer) disposed between the free layer 14a and the pinned layer 14c. In the MTJ element 14, the free layer 14a is electrically connected to the first end portion 12a via the non-magnetic conductive layer 13, and the pinned layer 14c is electrically connected to the bit line BL. In this context, a "variable magnetization direction" means that the magnetization direction is variable depending on a leakage magnetic field from the magnetic member 12 in a read operation to be described later, while a "fixed magnetization direction" means that the magnetization direction does not vary depending on the leakage magnetic field from the magnetic member 12.

The vertical thin film transistor 18 includes a channel layer 18a that has one end electrically connected to the pinned layer 14c of the magnetoresistive element 14 via the non-magnetic conductive layer 15 and the other end electrically connected to the bit line BL via the non-magnetic conductive layer 19. The channel layer 18a extends in the z direction. A gate electrode portion SG disposed to surround this channel layer 18a or at least to be on two opposed sides of the channel layer 18a. That is, the gate electrode portion SG covers at least part of the channel layer 18a. The channel layer 18a is formed from, for example, crystalline silicon. The gate electrode portion SG extends along the y direction.

The second end portion 12b is electrically connected to the plate electrode PL via the non-magnetic conductive body 30. One end of the non-magnetic conductive body 30 is located inside the second end portion 12b.

The field line FL extends along the y direction and is disposed between the flange portion 12f and the plate electrode PL. The yoke 40 is disposed in such a manner as to surround this field line FL. The yoke 40 has a first part 40a, a second part 40b, a third part 40c, and a fourth part 40d. The yoke 40 forms a magnetic circuit that intensifies a magnetic field produced when a current is fed through the field line FL.

The first part 40a of the yoke 40 is disposed in such a manner as to cover a portion of an upper surface of the field line FL and a side surface of the field line FL opposite to the side surface closer to the non-magnetic conductive body 30. The second part 40b is disposed below the field line FL and the flange portion 12f. The second part 40b is disposed in such a manner as to surround the second end portion 12b. The third part 40c is disposed in such a manner as to cover an upper surface of the flange portion 12f and one end of the non-magnetic conductive body 30. That is, the third part 40c covers one end of the non-magnetic conductive body 30 located inside the second end portion 12b and is, therefore, also disposed, at least in part, inside the second end portion 12b. The fourth part 40d is disposed in such a manner as to be connected to the third part 40c and to cover the side surface of the field line FL closer to the non-magnetic conductive body 30 and a portion of the upper surface of the field line FL.

The plate electrode PL, the bit line BL, and the field line FL are electrically connected to a control circuit 100.

Next, a write operation of writing data to and a read operation of reading data from the magnetic memory according to the first embodiment will be described.

(Write Operation)

The write operation for writing data to a magnetic memory according to the first embodiment will first be described.

To write data to the memory cell 10, write currents in reverse directions from each other are fed through the field line FL using the control circuit 100. For example, in a case of writing data to the memory cell 10, a write current is fed through the field line FL first. At this time, a clockwise current magnetic field is produced around the field line FL when the write current is fed through the field line FL from frontward in a depth direction in FIG. 1. This current magnetic field also induces a magnetic field in the yoke 40 that surrounds the field line FL. This write current causes information (as a magnetization direction) corresponding to the write current to be written to the flange portion 12f located below the field line FL. The information written at this time is a magnetization direction that is along an x-y plane and oriented from an outer periphery to an inner periphery of the magnetic member 12 (inward direction).

On the other hand, when a direction of the write current fed through the field line FL is reversed from that described above, the information written to the magnetic member 12 of the memory cell 10 is a magnetization direction that is along the x-y plane but is oriented from the inner periphery to the outer periphery of the magnetic member 12 (outward direction).

Performing the write operation in this way makes it possible to write the information to an upper portion (second end portion 12b) of the magnetic member 12. Next, a voltage is applied to the gate electrode portion SG of the vertical thin film transistor 18 by the control circuit 100 and the vertical thin film transistor 18 is set into an on-state (conductive). In this state, a shift current that moves the domain wall of the magnetic member 12 is fed by the control circuit 100 between the bit line BL and the plate electrode PL, and the just written information is moved downward and stored in a storage area. This process is referred to as a shift operation. It is noted that a polarity of a direction of the shift current can be determined depending on the material of the magnetic member 12 or the like. In this way, the written information is stored in the storage area of the magnetic member 12.

(Read Operation)

A read operation will next be described. In a case of reading information from the memory cell 10, a voltage is supplied from the control circuit 100 to the gate electrode portion SG of the vertical thin film transistor 18 and the vertical thin film transistor 18 is set into an on-state. When the information to be read is located in a lowermost portion of the magnetic member 12 in the memory cell 10, that is, in a region closest to the MTJ element 14, the magnetization direction of the free layer 14a of the MTJ element 14 varies depending on a leakage magnetic field from the information stored in the lowermost portion of the magnetic member 12. Therefore, a read current is supplied between the bit line BL and the plate electrode PL using the control circuit 100, and the information from the MTJ element 14 is read. This read information corresponds to a resistance state of the MTJ element 14. A case where the MTJ element 14 is in a high resistance state corresponds to, for example, antiparallel state in which the magnetization direction of the free layer 14a of the MTJ element 14 differs from a magnetization direction of the pinned layer 14c thereof. A case where the MTJ element 14 is in a low resistance state corresponds to a parallel state in which the magnetization direction of the free layer 14a of the MTJ element 14 is matches the magnetization direction of the pinned layer 14c.

In a case where the information to be read is not present in the lowermost portion of the magnetic member 12 in the memory cell 10, then a shift current is supplied between the bit line BL and the plate electrode PL using the control circuit 100, and the information to be read is moved along the magnetic member (domain wall) in such a manner as to cause the information to be read to be located in the lowermost portion of the magnetic member 12. Subsequently, the information can be read by performing the read operation described above.

As described so far, according to the first embodiment, it is possible to arrange the magnetic member 12 in a highly integrated fashion since the first end portion 12a of the magnetic member 12 is electrically connected to the magnetoresistive element 14 and the second end portion 12b thereof is electrically connected to the plate electrode PL. Furthermore, in the first embodiment, the vertical thin film transistor 18 is used as a selection element that selects the memory cell 10. Owing to this, compared with a case of using a two-terminal switching element as a selection element, the hold current necessary for such a switching element becomes unnecessary and it is possible to extend a margin between a value of the read current and a value of the shift current.

Second Embodiment

Figure 3:
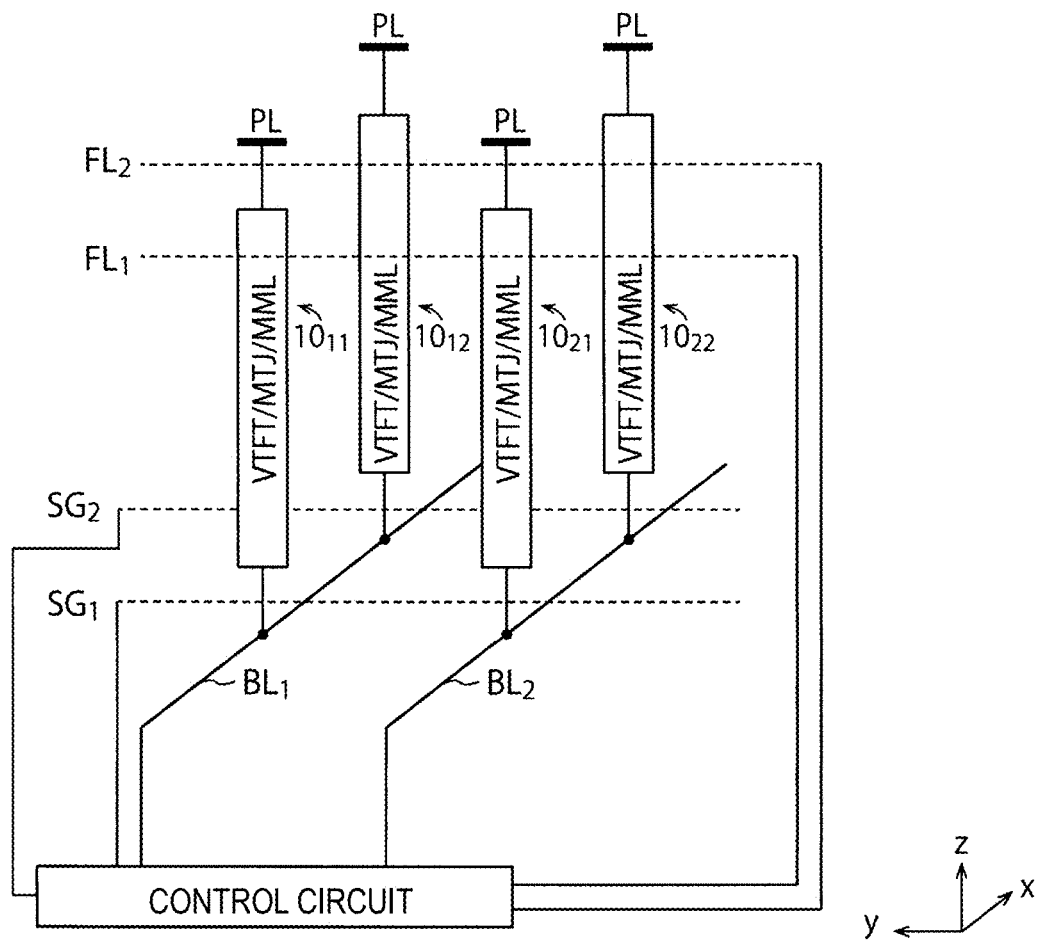
FIG. 3 is a perspective view showing a magnetic memory according to a second embodiment.

FIG. 3 shows a magnetic memory according to a second embodiment. The magnetic memory according to the second embodiment is configured with memory cells $10_{11}$, $10_{12}$, $10_{21}$, and $10_{22}$ disposed in a matrix configuration of two rows and two columns. Each memory cell $10_{ij}$ (i, j=1, 2) has a magnetic member $12_{ij}$, a magnetoresistive element $14_{ij}$, and a vertical thin film transistor $18_{ij}$. Each magnetic member $12_{ij}$ (i, j=1, 2) is identical to the magnetic member 12 according to the first embodiment. Each magnetoresistive element $14_{ij}$ (i, j=1, 2) is identical to the magnetoresistive element 14 according to the first embodiment. Each vertical thin film transistor $18_{ij}$ (i, j=1, 2) is identical to the vertical thin film transistor 18 according to the first embodiment. That is, each memory cell $10_{ij}$ (i, j=1, 2) is identical in configuration to the memory cell 10 according to the first embodiment. While the memory cells $10_{11}$ to $10_{22}$ are disposed in an array of two rows and two columns in the present example, the memory cells $10_{11}$ to $10_{22}$ may instead be disposed in an array of m rows and n columns, where m and n are any natural numbers.

The first end portion 12a of each magnetic member $12_{ij}$ (i, j=1, 2) is electrically connected to the free layer 14a of the corresponding magnetoresistive element $14_{ij}$, and the second end portion 12b thereof is electrically connected to the plate electrode PL, similarly to the case shown in FIG. 1. This plate electrode PL can be shared among the memory cells $10_{ij}$. The pinned layer 14c of each magnetoresistive element $14_{ij}$ is electrically connected to one end of the corresponding vertical thin film transistor $18_{ij}$ The other end of each vertical thin film transistor $18_{ij}$ is electrically connected to a bit line $BL_i$ (i=1, 2) corresponding to the vertical thin film transistor $18_{ij}$. The bit lines $BL_1$ and $BL_2$ extend along the x direction. Furthermore, each vertical thin film transistor $18_{ij}$ has a gate electrode portion $SG_j$ (j=1, 2), similarly to the case shown in FIG. 1. These gate electrode portions $SG_1$ and $SG_2$ extend along the y direction. A field line $FL_1$ common to the memory cells $10_{11}$ and $10_{21}$ is provided, and a field line $FL_2$ common to the memory cells $10_{12}$ and $10_{22}$ is provided. These field lines $FL_1$ and $FL_2$ extend along the y direction. Each field line $FL_j$ (j=1, 2) is covered with a yoke 40, similarly to the case of the first embodiment shown in FIG. 1. The plate electrode PL, the bit lines $BL_1$ and $BL_2$, the gate electrode portions $SG_1$ and $SG_2$, and the field lines $FL_1$ and $FL_2$ are electrically connected to the control circuit 100.

A write operation in the magnetic memory according to the second embodiment is performed similarly to the write operation described for the first embodiment. In a case of writing information to, for example, the memory cell $10_{11}$, the write operation is performed by supplying a write current from the control circuit 100 to the corresponding field line $FL_1$.

A read operation is performed as follows. If information from the memory cell $10_{11}$ is to be read, then a voltage is supplied first from the control circuit 100 to the gate electrode portion $SG_1$ of the vertical thin film transistor $18_{11}$ belonging to the memory cell $10_{11}$, and the vertical thin film transistor $18_{11}$ is set into an on-state. Subsequently, a shift current is supplied from the control circuit 100 between the bit line $BL_1$ corresponding to the memory cell $10_{11}$ and the plate electrode PL, and the information is moved to a region in the vicinity of the first end portion 12a of the magnetic member $12_{11}$. A read current is then supplied from the control circuit 100 between the bit line $BL_1$ corresponding to the memory cell $10_{11}$ and the plate electrode PL, and the information is read.

In the magnetic memory according to the second embodiment, it is possible to arrange each magnetic member $12_{ij}$ in a highly integrated fashion since the first end portion $12a$ of the magnetic members $12_{ij}$ is electrically connected to the corresponding magnetoresistive element $14_{ij}$, and the second end portion $12b$ thereof is electrically connected to the plate electrode PL. Furthermore, in the second embodiment, a vertical thin film transistor $18_{ij}$ is used as a selection element that selects a corresponding memory cell $10_{ij}$. Owing to this, compared with the case of using the two-terminal switching element as the selection element, the hold current otherwise necessary for the switching element becomes unnecessary and it is possible to extend the margin between the value of the read current and the value of the shift current.

Figure 4:
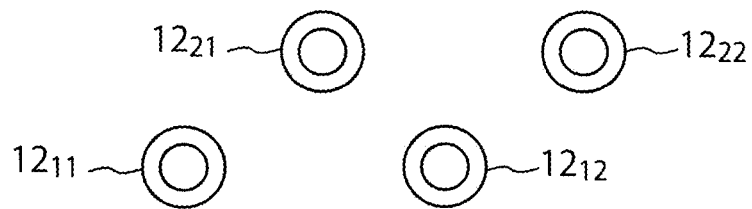
FIG. 4 shows planar arrangement of magnetic members in a magnetic memory according to a modification of the second embodiment.

It is noted that it is preferable in the second embodiment that the magnetic members $12_{11}$ to $12_{22}$ are disposed in such a manner that the magnetic members $12_{11}$ and $12_{12}$ arranged in a first row and the magnetic members $12_{21}$ and $12_{22}$ arranged in a second row are dense (closely packed/arranged), such as shown in FIG. 4. That is, it is preferable that the magnetic member $12_{m+1,n}$ in an (m+1)-th row and an n-th column is disposed at a position of the (m+1)-th row corresponding to a position between the magnetic member $12_{mn}$ in an m-th row and the n-th column and the magnetic member $12_{m,n+1}$ in an m-th row and the (n+1)-th column, where m and n are natural numbers. Disposing the plurality of magnetic members densely in this way makes it possible to achieve higher integration.

Figure 5:
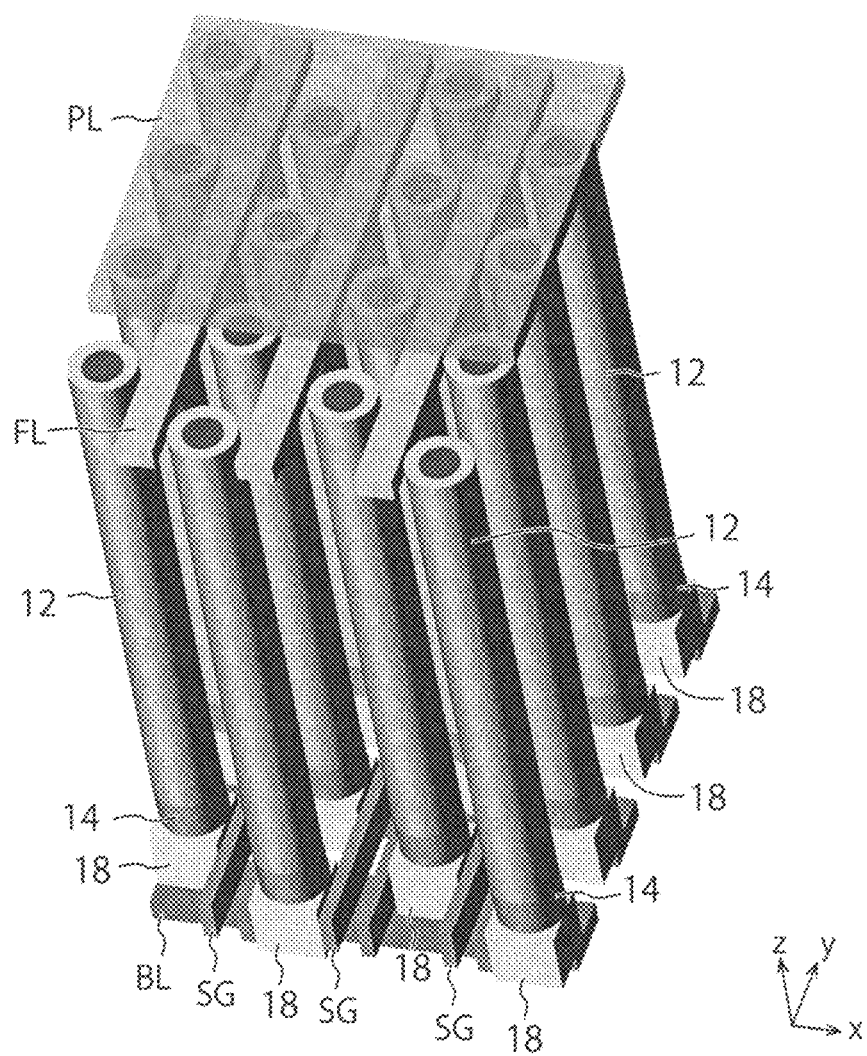
FIG. 5 is a perspective view showing a magnetic memory according to the modification of the second embodiment.

FIG. 5 is a perspective view of a magnetic memory according to a modification of the second embodiment for arranging a plurality of magnetic members 12 densely. The magnetic memory according to this modification has magnetic members 12 disposed in a matrix of four rows and four columns. The magnetic memory according to this modification can achieve higher integration. In addition, similarly to the magnetic memory according to the second embodiment, it is possible to extend the margin between the value of the read current and the value of the shift current.

Third Embodiment

Figure 6:
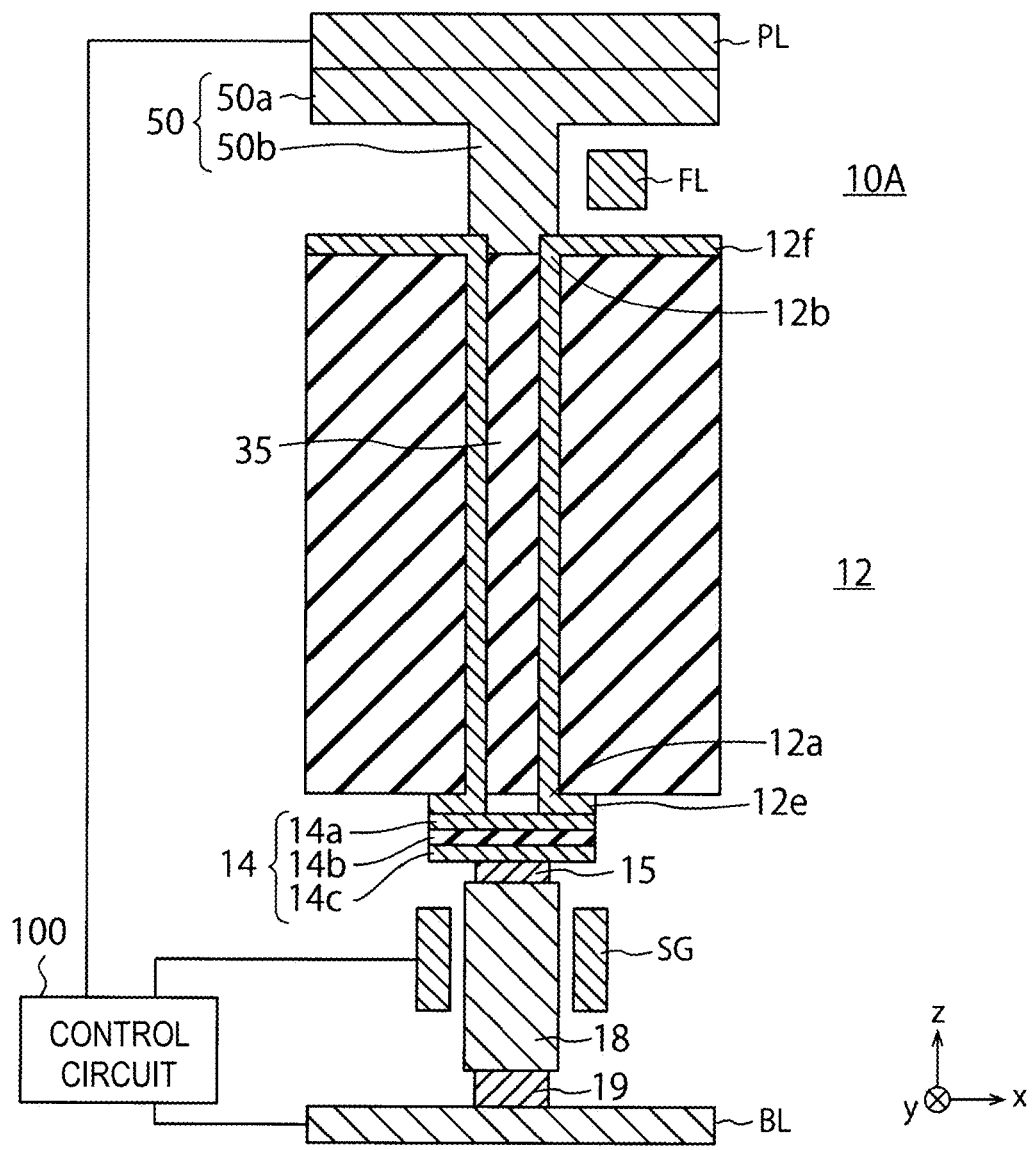
FIG. 6 is a cross-sectional view showing a magnetic memory according to a third embodiment.

FIG. 6 shows a magnetic memory according to a third embodiment. The magnetic memory according to this third embodiment is configured with at least one memory cell 10A, and this memory cell 10A lacks a yoke 40 that, in the first embodiment, covers the field line FL, the non-magnetic conductive body 30, and the non-magnetic conductive layer 13 in the memory cell 10. A yoke 50 is instead provided in the third embodiment.

The memory cell 10A includes a magnetic member 12, a magnetoresistive element 14, a non-magnetic conductive layer 15, a vertical thin film transistor 18, a non-magnetic conductive layer 19, a bit line BL, a yoke 50, a plate electrode PL, and a field line FL.

The yoke 50 has a first part $50a$ matching the shape of the plate electrode PL shown in FIG. 1. A second part $50b$ of the yoke 50 electrically connects this first part $50a$ to the second end portion $12b$ and the flange portion $12f$. The first part $50a$ is disposed in such a manner as to be located immediately under and in contact with the plate electrode PL.

The first end portion $12a$ is electrically connected to the free layer $14a$ via the flange portion $12e$. The pinned layer $14c$ is electrically connected to one end of the vertical thin film transistor 18 via the non-magnetic conductive layer 15. The other end of the vertical thin film transistor 18 is electrically connected to the bit line BL via the non-magnetic conductive layer 19. The bit line BL extends along the x direction. The gate electrode portion SG of the vertical thin film transistor 18 extends along the y direction. The field line FL extends along the y direction.

A write operation in the magnetic memory configured in the manner of the third embodiment is performed similarly to the case of the magnetic memory according to the first embodiment as described with reference to FIG. 1. In a case of supplying a write current from the control circuit 100 to the field line FL, then a current magnetic field is produced around the field line FL, this current magnetic field is intensified by the yoke 50, and information is written to the second end portion $12b$ of the magnetic member 12. A read operation is performed similarly to the case of the magnetic memory according to the first embodiment described with reference to FIG. 1.

In the magnetic memory according to this third embodiment, similarly to the first embodiment, it is possible to arrange the magnetic member 12 in a highly integrated fashion since the first end portion $12a$ of the magnetic member 12 is electrically connected to the magnetoresistive element 14 and the second end portion $12b$ thereof is electrically connected to the plate electrode PL. Furthermore, in the third embodiment, the vertical thin film transistor 18 is used as the selection element that selects the memory cell 10A. Owing to this, compared with the case of using the two-terminal switching element as the selection element, the hold current otherwise necessary for the switching element becomes unnecessary and it is possible to extend the margin between the value of the read current and the value of the shift current.

Fourth Embodiment

A magnetic memory according to a fourth embodiment will be described with reference to FIG. 7. The magnetic memory according to this fourth embodiment is configured with memory cells arranged in a matrix of m rows and n columns, where m and n are natural numbers. These memory cells are configured similarly to the memory cell 10A shown in FIG. 6.

Figure 7:
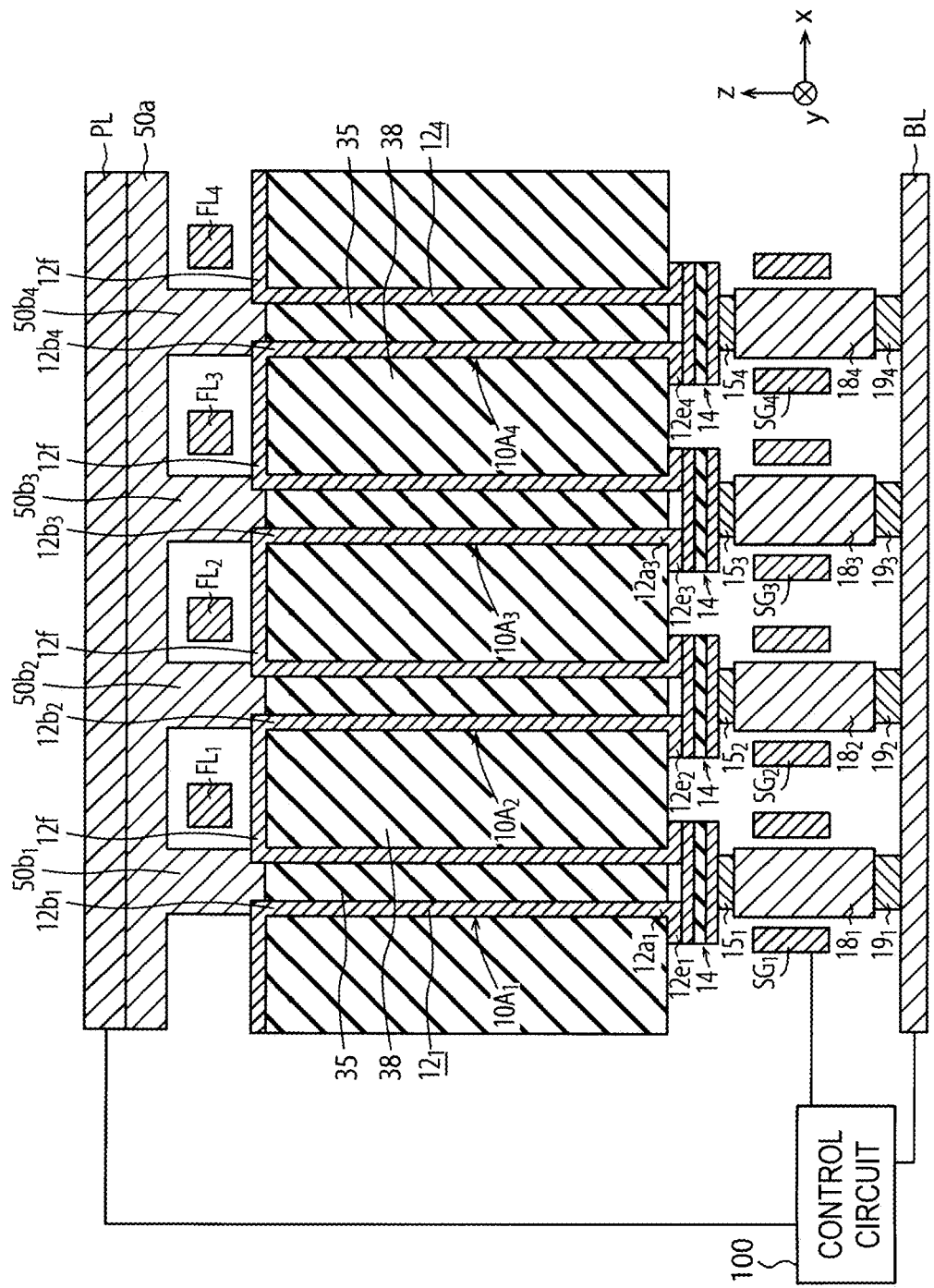
FIG. 7 is a cross-sectional view showing a magnetic memory according to a fourth embodiment.

FIG. 7 shows a cross-section of the magnetic memory according to this fourth embodiment by being cut along, for example, the first row. As shown in FIG. 7, the magnetic memory according to the fourth embodiment is configured with four memory cells $10A_1$ to $10A_4$ in the first row. Each memory cell $10A_i$ (i=1, 2, 3, 4) is configured with a magnetic member $12i$, a magnetoresistive element $14_i$, a vertical thin film transistor $18_i$, a non-magnetic conductive layer $19_i$, a yoke 50, a field line $FL_i$, and the plate electrode PL. In addition, the yoke 50 is configured with the first part $50a$ being formed from, for example, a soft magnetic material identical in shape to the plate electrode PL, and second parts $50_1$ to $50_4$ also formed from, for example, a soft magnetic material. The second parts $50b_i$ (i=1, 2, 3, 4) are provided to correspond to the memory cells $10A_i$, respectively, and electrically connect the first part $50a$ to the magnetic members $12_i$ of the corresponding memory cells $10A_i$.

Similarly to the case of the third embodiment shown in FIG. 6, a first end portion $12a_i$ of each magnetic member $12_i$ is electrically connected to one end (for example, the free layer $14a$ shown in FIG. 6) of the magnetoresistive element $14_i$ via the flange portion $12e_i$, and a second end portion $12b_i$ thereof is electrically connected to the corresponding second part 50$b_i$ of the yoke 50 via the flange portion 12$f$. The other end (pinned layer 14$c$ shown in FIG. 6) of each magnetoresistive element 14$_i$ is electrically connected to one end of the corresponding vertical thin film transistor 18$_i$ via the non-magnetic conductive layer 15$_i$. The insulator portion 35 is disposed in a cylindrical interior of each magnetic member 12$_i$. An insulating film 38 is provided between the adjacent magnetic members 12$_i$.

The other end of each vertical thin film transistor 18$_i$ is electrically connected to a bit line BL via the non-magnetic conductive layer 19$_i$. It is noted that the bit lines BL are provided to correspond to each row of the memory cells 10A$_i$ and a bit line BL is shared among the memory cells 10A$_i$ in each row. Furthermore, the gate electrode portion SG of the vertical thin film transistor 18$_i$ is shared among the memory cells 10A$_i$ in each column, similarly to the case of the second embodiment shown in FIG. 3.

Moreover, a field line FL$_i$ is provided to correspond to each memory cell 10A$_i$. Each field line FL$_i$ is disposed between the flange portion 12$f$ of the magnetic member 12$_i$ of the corresponding memory cell 10A$_i$ and the yoke 50.

In a case of writing information to any of the memory cells 10A$_i$, a write operation is performed by supplying a write current from the control circuit 100 to the corresponding field line FL$_i$. The shift operation of shifting the written information and the read operation of reading the information are performed similarly to methods described in the third embodiment.

In the magnetic memory according to the fourth embodiment configured in this way, similarly to the third embodiment, it is possible to arrange each magnetic member 12$_i$ in a highly integrated fashion since the first end portion 12$a_i$ of the magnetic member 12$_i$ is electrically connected to the magnetoresistive element 14$_i$, and the second end portion 12$b_i$ thereof is electrically connected to the plate electrode PL. Furthermore, in the fourth embodiment, the vertical thin film transistor 18$_i$ is used as a selection element that selects one memory cell 10A$_i$. Owing to this, compared with the case of using the two-terminal switching element as the selection element, the hold current otherwise necessary for the switching element becomes unnecessary and it is possible to extend the margin between the value of the read current and the value of the shift current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory, comprising:
   an electrode that extends in a plane including a first direction and a second direction crossing the first direction;
   a first interconnection wiring that extends along the first direction and is spaced from the electrode in a third direction orthogonal to the plane;
   a first magnetic member between the electrode and the first interconnection wiring in the third direction, the first magnetic member having a first end facing the first interconnection wiring and a second end facing the electrode;
   a first magnetoresistive element electrically connected to the first end of the first magnetic member;
   a first transistor between the first magnetoresistive element and the first interconnection wiring, the first transistor having a first channel layer extending in the third direction and a first gate electrode covering at least part of an outer periphery of the first channel layer, one end of the first channel layer being electrically connected to the first magnetoresistive element and another end of the first channel layer being electrically connected to the first interconnection wiring;
   a second interconnection wiring with a portion between the electrode and the second end of the first magnetic member; and
   a control circuit that is electrically connected to the first gate electrode, the electrode, the first interconnection wiring, and the second interconnection wiring.

2. The magnetic memory according to claim 1, further comprising:
   a first non-magnetic conductor between the electrode and the second end of the first magnetic member, the first non-magnetic conductor electrically connecting the electrode to the second end of the first magnetic member; and
   a first magnetic body that surrounds part of the second interconnection wiring between the electrode and the second end of the first magnetic member.

3. The magnetic memory according to claim 2, wherein the first magnetic member has a cylindrical shape, and the first non-magnetic conductor has one end electrically connected to the electrode and another end extending into the first magnetic member and electrically connected to the first magnetic member.

4. The magnetic memory according to claim 1, further comprising:
   a third interconnection wiring that extends along the first direction and is electrically connected to the control circuit, the first and third interconnection wirings being spaced apart in the second direction;
   a second magnetic member between the electrode and the third interconnection wiring in the third direction, the second magnetic member having a first end facing the third interconnection wiring and a second end facing the electrode;
   a second magnetoresistive element electrically connected to the first end of the second magnetic member;
   a second transistor between the second magnetoresistive element and the third interconnection wiring, the second transistor having a second channel layer extending in the third direction and a second gate electrode covering at least part of an outer periphery of the second channel layer, one end of the second channel layer being electrically connected to the second magnetoresistive element and another end of the second channel layer being electrically connected to the third interconnection wiring; and
   a fourth interconnection wiring electrically connecting the second gate electrode to the first gate electrode and electrically connected to the control circuit, wherein the second interconnection wiring has another portion between the electrode and the second end of the second magnetic member.

5. The magnetic memory according to claim 4, further comprising:
   a third magnetic member between the electrode and the first interconnection wiring, the third magnetic member having a first end facing the first interconnection wiring and a second end facing the electrode, the first and third magnetic members being spaced from each other in the first direction;

a third magnetoresistive element electrically connected to the first end of the third magnetic member;

a third transistor between the third magnetoresistive element and the first interconnection wiring, the third transistor having a third channel layer extending in the third direction and a third gate electrode covering at least part of an outer periphery of the third channel layer, one end of the third channel layer electrically connected to the third magnetoresistive element and another end of the third channel layer being electrically connected to the first interconnection wiring;

a fifth interconnection wiring electrically connecting the third gate electrode to the control circuit; and a sixth interconnection wiring that includes a portion between the electrode and the second end of the third magnetic member.

6. The magnetic memory according claim 1, further comprising:

a non-magnetic insulator portion surrounded by the first magnetic member, wherein the first magnetic member includes first, second, third, and fourth portions spaced along the third direction between the first and second ends, the first to fourth portions each surround the non-magnetic insulator portion, the second portion is between the first portion and the fourth portion, the third portion is between the second portion and fourth portion, the first portion has a first width in a direction perpendicular to the third direction, the second portion has a second width in the direction perpendicular to the third direction, the third portion has a third width in the direction perpendicular to the third direction, the fourth portion has a fourth width in the direction perpendicular to the third direction, and the first width and the third width are larger than each of the second width and the fourth width.

7. The magnetic memory according to claim 1, wherein the first magnetoresistive element is a magnetic tunnel junction element.

8. A magnetic memory, comprising:

an electrode that extends in a plane including a first direction and a second direction crossing the first direction;

a first interconnection wiring that extends along the first direction and is spaced from the electrode in a third direction orthogonal to the plane;

a first magnetic member between the electrode and the first interconnection wiring in the third direction, the first magnetic member having a first end facing the first interconnection wiring and a second end facing the electrode;

a first magnetoresistive element electrically connected to the first end of the first magnetic member;

a first transistor between the first magnetoresistive element and the first interconnection wiring, the first transistor having a first channel layer extending in the third direction and a first gate electrode covering at least part of an outer periphery of the first channel layer, one end of the first channel layer being electrically connected to the first magnetoresistive element and another end of the first channel layer being electrically connected to the first interconnection wiring;

a second interconnection wiring with a portion between the electrode and the second end of the first magnetic member;

a second magnetic member between the electrode and the first interconnection wiring, the second magnetic member having a first end facing the first interconnection wiring and a second end facing the electrode, a portion of the second magnetic member connecting the second end of the second magnetic member to the second end of the first magnetic member; and a control circuit that is electrically connected to the first gate electrode, the electrode, the first interconnection wiring, and the second interconnection wiring.

9. The magnetic memory according to claim 8, further comprising:

a second magnetoresistive element electrically connected to the first end of the second magnetic member; and a second transistor between the second magnetoresistive element and the first interconnection wiring, wherein the first transistor has a second channel layer extending in the third direction and a second gate electrode covering at least part of an outer periphery of the second channel layer, and one end of the second channel layer is electrically connected to the second magnetoresistive element and another end of the first channel layer is electrically connected to the first interconnection wiring.

10. The magnetic memory according to claim 8, further comprising:

a third magnetic member between the electrode and the second ends of the first and second magnetic members.

11. The magnetic memory according to claim 10, wherein the third magnetic member has a planar shape matching the electrode.

12. The magnetic memory according to claim 8, further comprising:

a non-magnetic insulator portion surrounded by the first magnetic member, wherein the first magnetic member includes first, second, third, and fourth portions spaced along the third direction between the first and second ends, the first to fourth portions each surround the non-magnetic insulator portion, the second portion is between the first portion and the fourth portion, the third portion is between the second portion and fourth portion, the first portion has a first width in a direction perpendicular to the third direction, the second portion has a second width in the direction perpendicular to the third direction, the third portion has a third width in the direction perpendicular to the third direction, the fourth portion has a fourth width in the direction perpendicular to the third direction, and the first width and the third width are larger than each of the second width and the fourth width.

13. A magnetic memory, comprising:

an electrode that extends in a plane including a first direction and a second direction crossing the first direction;

a first interconnection wiring that extends along the first direction and is spaced from the electrode in a third direction orthogonal to the plane;

a first magnetic member between the electrode and the first interconnection wiring in the third direction, the first magnetic member having a first end facing the first interconnection wiring and a second end facing the electrode;

a first magnetoresistive element electrically connected to the first end of the first magnetic member;

a first transistor between the first magnetoresistive element and the first interconnection wiring, the first transistor having a first channel layer extending in the third direction and a first gate electrode covering at least part of an outer periphery of the first channel layer, one end of the first channel layer being electrically connected to the first magnetoresistive element, and another end of the first channel layer being electrically connected to the first interconnection wiring;

a second magnetic member between the second end of the first magnetic member and the electrode, the second magnetic member electrically connecting the electrode to the first magnetic member; and a control circuit that is electrically connected to the first gate electrode, the electrode, and the first interconnection wiring.

14. The magnetic memory according to claim 13, wherein the second magnetic member has a first part connected to the electrode and a second part connected to the second end of the first magnetic member, the first part has a planar shape matching the electrode, and the second part is narrower than the first part in at least one of the first and second directions.

15. The magnetic memory according to claim 14, further comprising:

a field line between the electrode and the second end of the first magnetic member, wherein the field line is electrically connected to the control circuit.

16. The magnetic memory according to claim 15, wherein the field line is between the first part of the second magnetic member and the second end of the first magnetic member.

17. The magnetic memory according to claim 16, further comprising:

a second interconnection wiring that extends along the first direction and is electrically connected to the control circuit, the first and second interconnection wirings being spaced apart in the second direction;

a third magnetic member between the electrode and the second interconnection wiring in the third direction, the third magnetic member having a first end facing the second interconnection wiring and a second end facing the electrode;

a second magnetoresistive element electrically connected to the first end of the third magnetic member; and a second transistor between the second magnetoresistive element and the second interconnection wiring, the second transistor having a second channel layer extending in the third direction and a second gate electrode covering at least part of an outer periphery of the second channel layer, one end of the second channel layer being electrically connected to the second magnetoresistive element and another end of the second channel layer being electrically connected to the second interconnection wiring, the second gate electrode being electrically connected to the control circuit, wherein the field line includes a portion between the electrode and the second end of the third magnetic member.

18. The magnetic memory according to claim 13, wherein the first magnetic member has a cylindrical shape.

19. The magnetic memory according to claim 13, wherein the first magnetoresistive element is a magnetic tunnel junction element.

20. The magnetic memory according claim 13, further comprising:

a non-magnetic insulator portion surrounded by the first magnetic member, wherein the first magnetic member includes first, second, third, and fourth portions spaced along the third direction between the first and second ends, the first to fourth portions each surround the non-magnetic insulator portion, the second portion is between the first portion and the fourth portion, the third portion is between the second portion and fourth portion, the first portion has a first width in a direction perpendicular to the third direction, the second portion has a second width in the direction perpendicular to the third direction, the third portion has a third width in the direction perpendicular to the third direction, the fourth portion has a fourth width in the direction perpendicular to the third direction, and the first width and the third width are larger than each of the second width and the fourth width.

* * * * *